Figure 1:
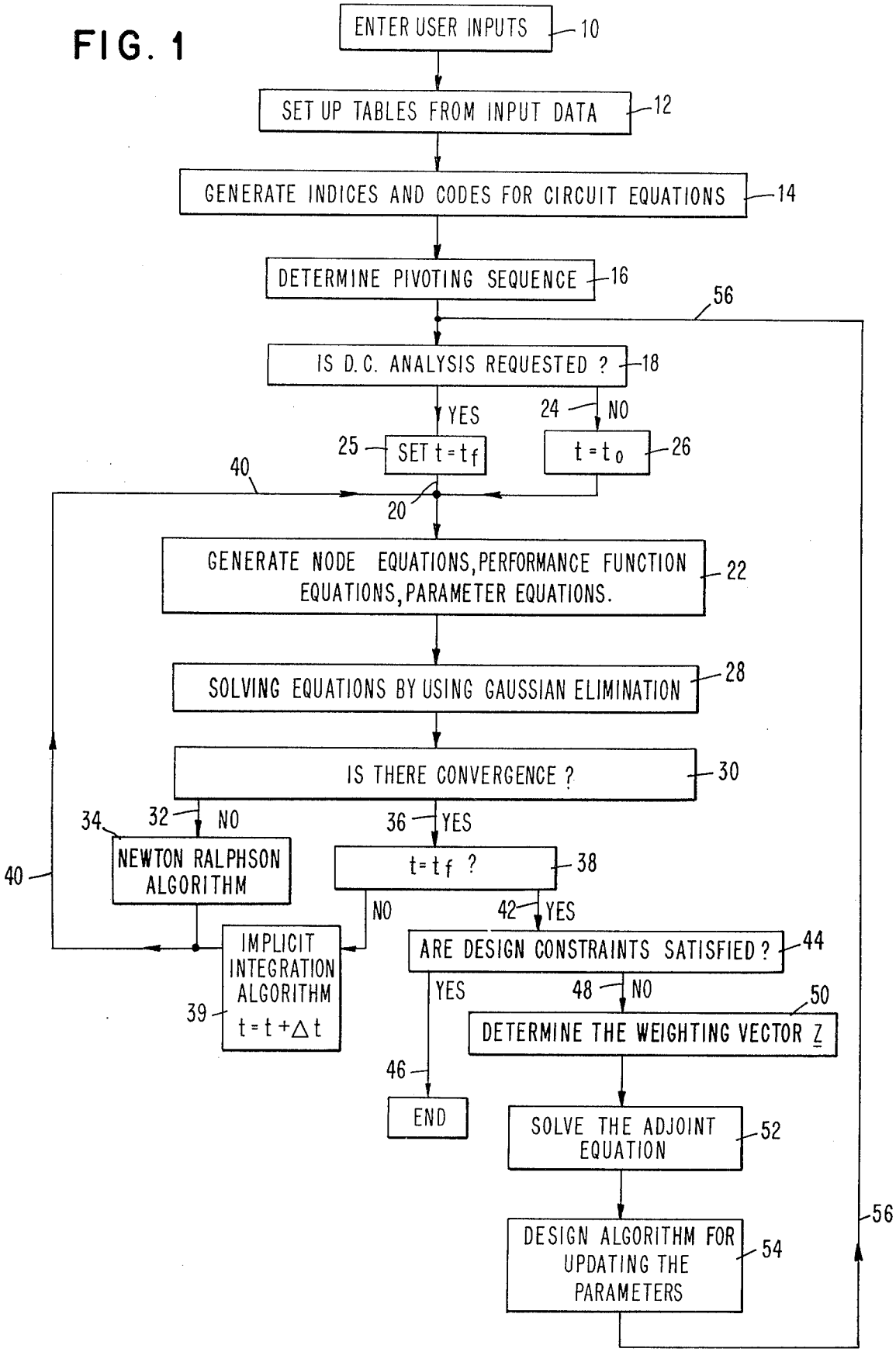
Figure 2:
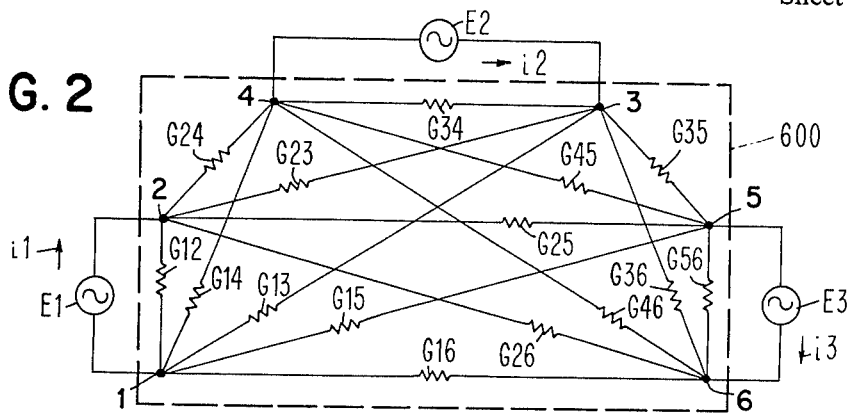
Figure 3A:
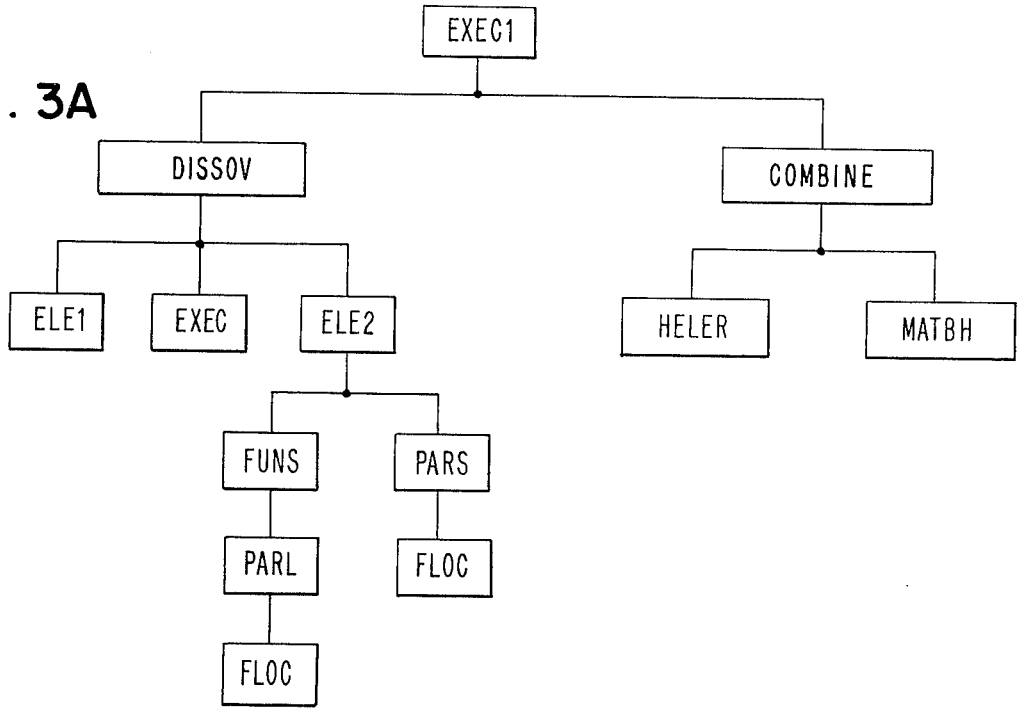
Figure 3B:
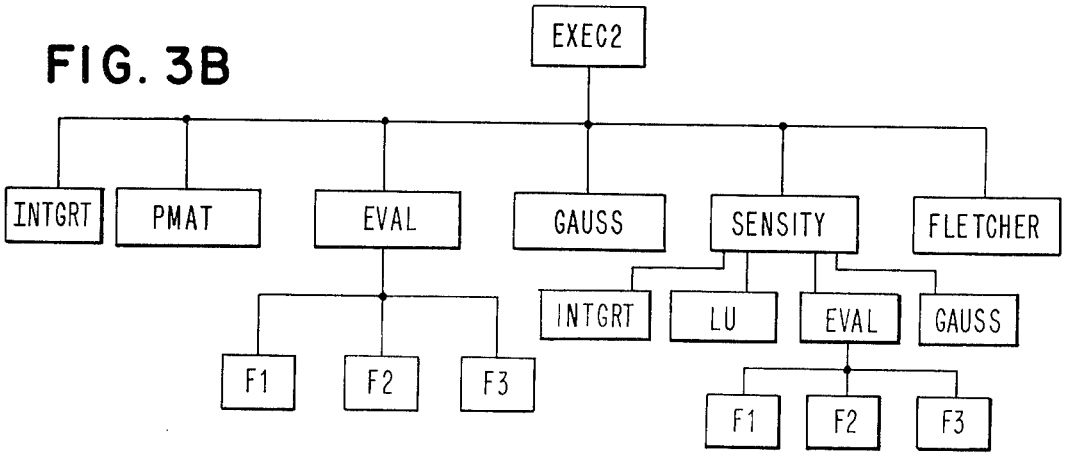
Figure 4:
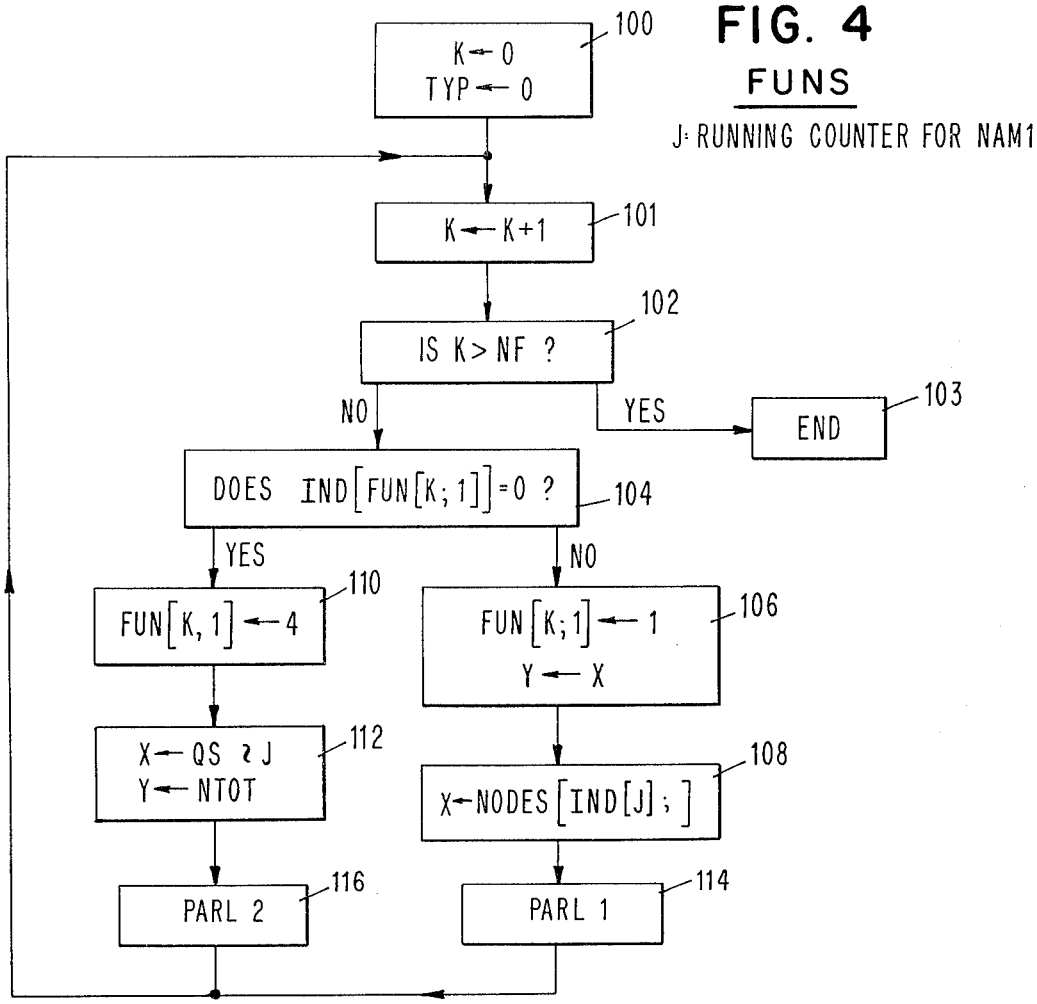
Figure 6:
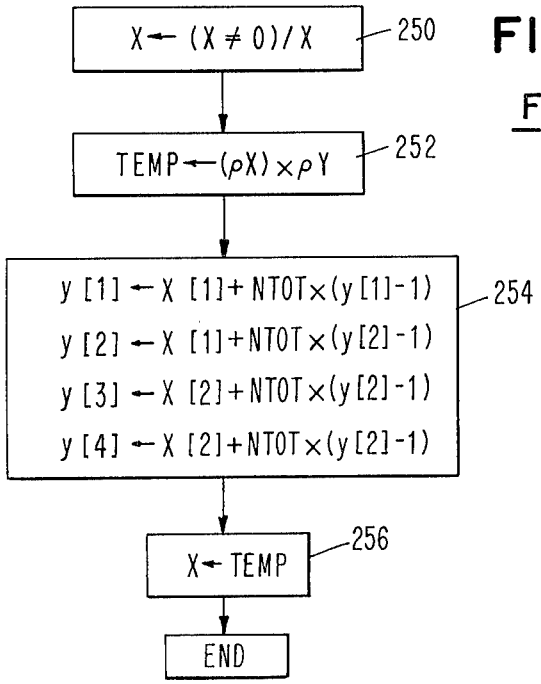
Figure 5:
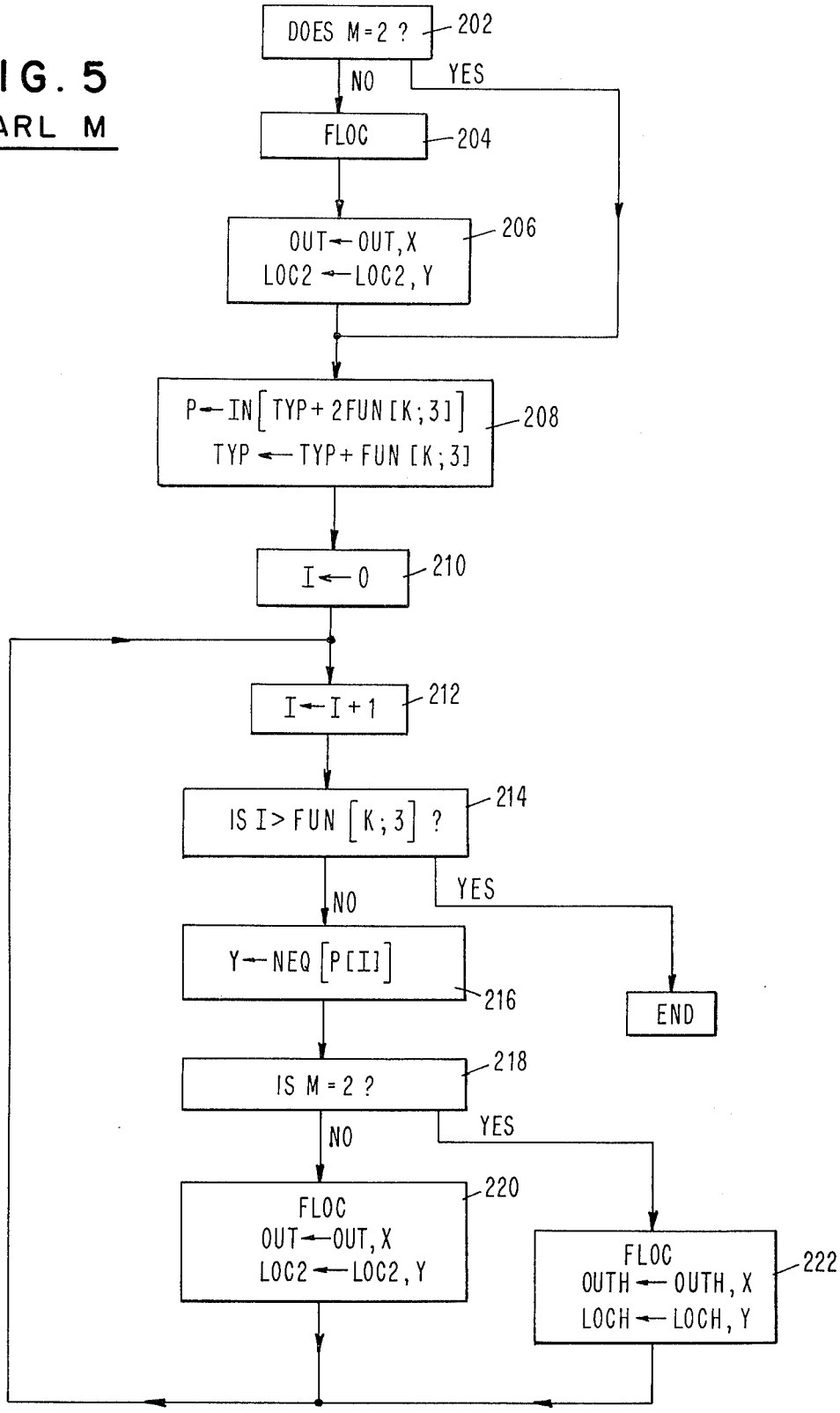
Figure 7:
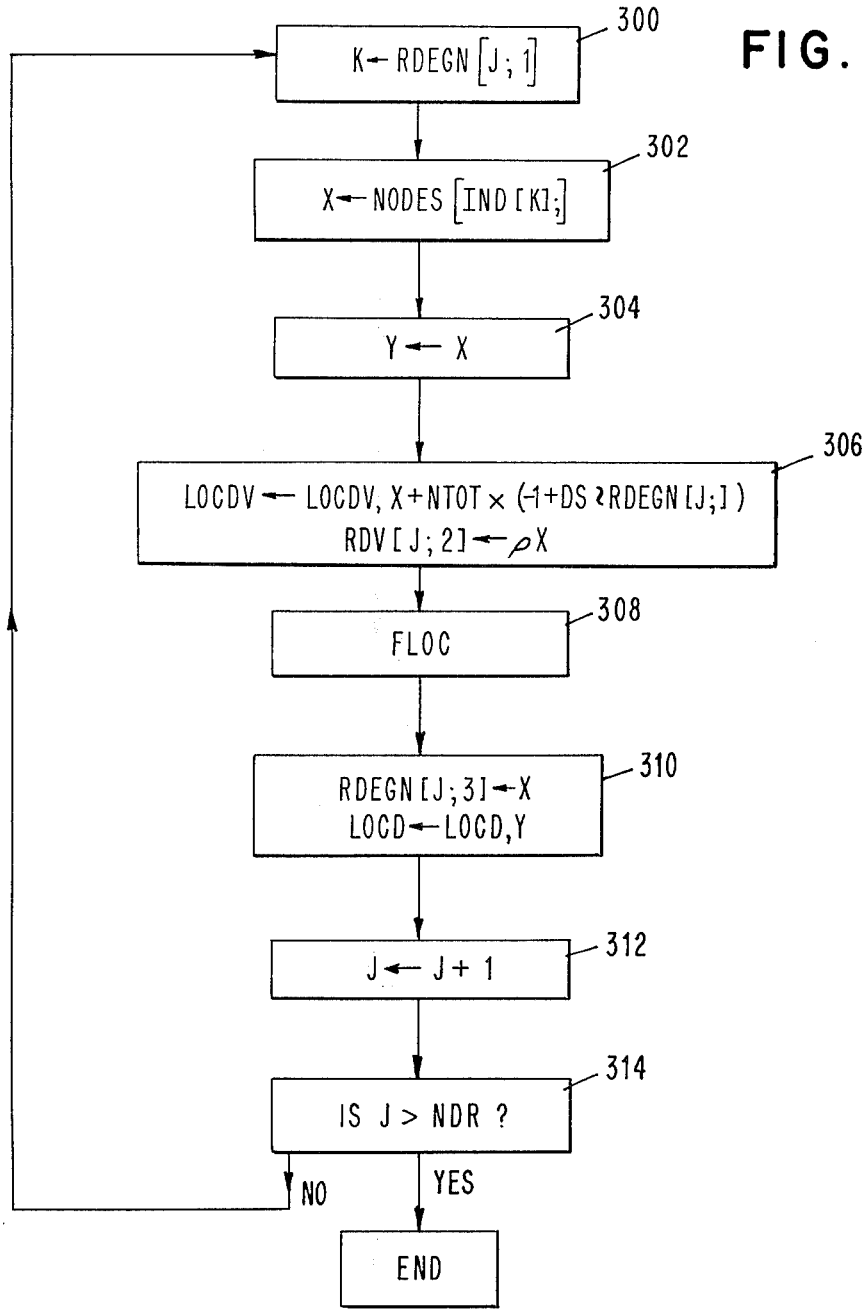
Figure 10:
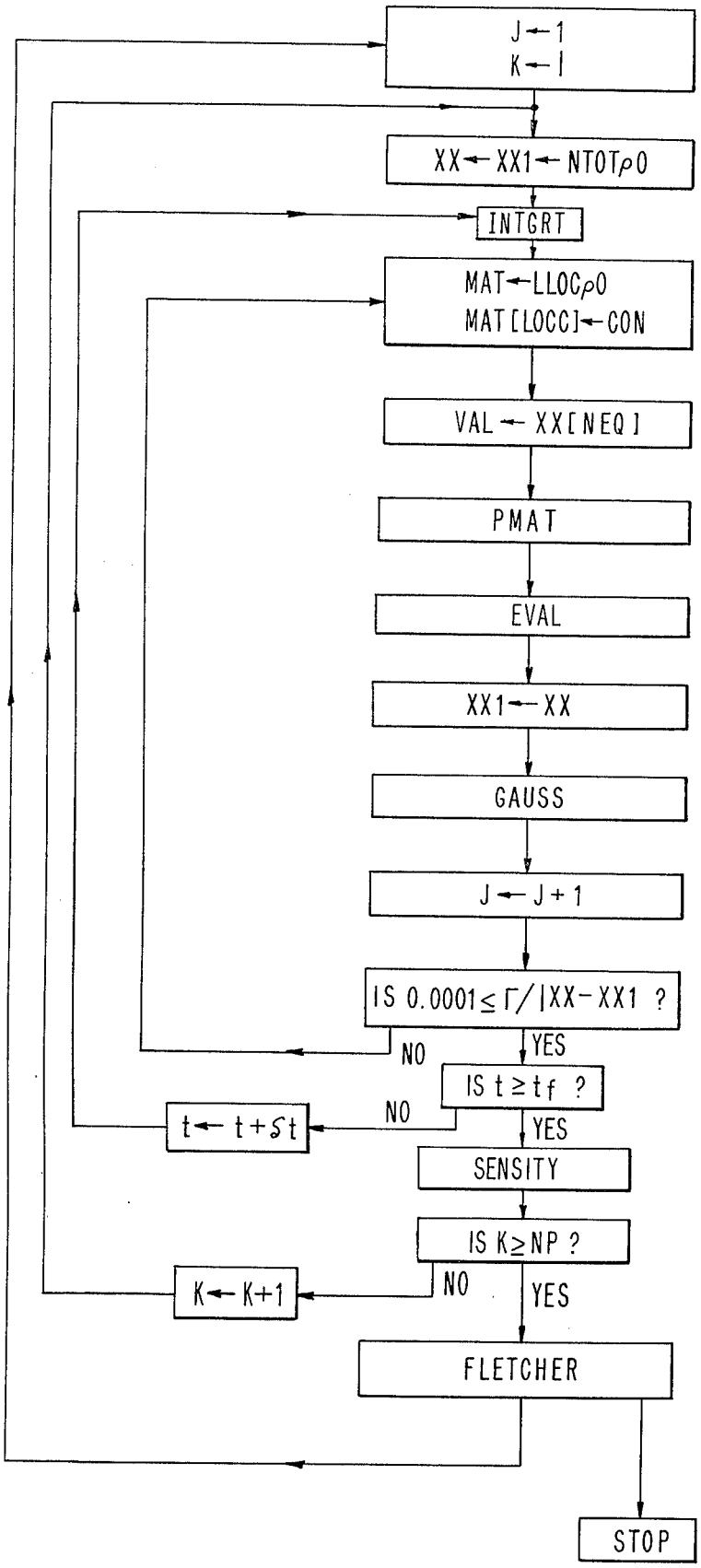
Figure 11:
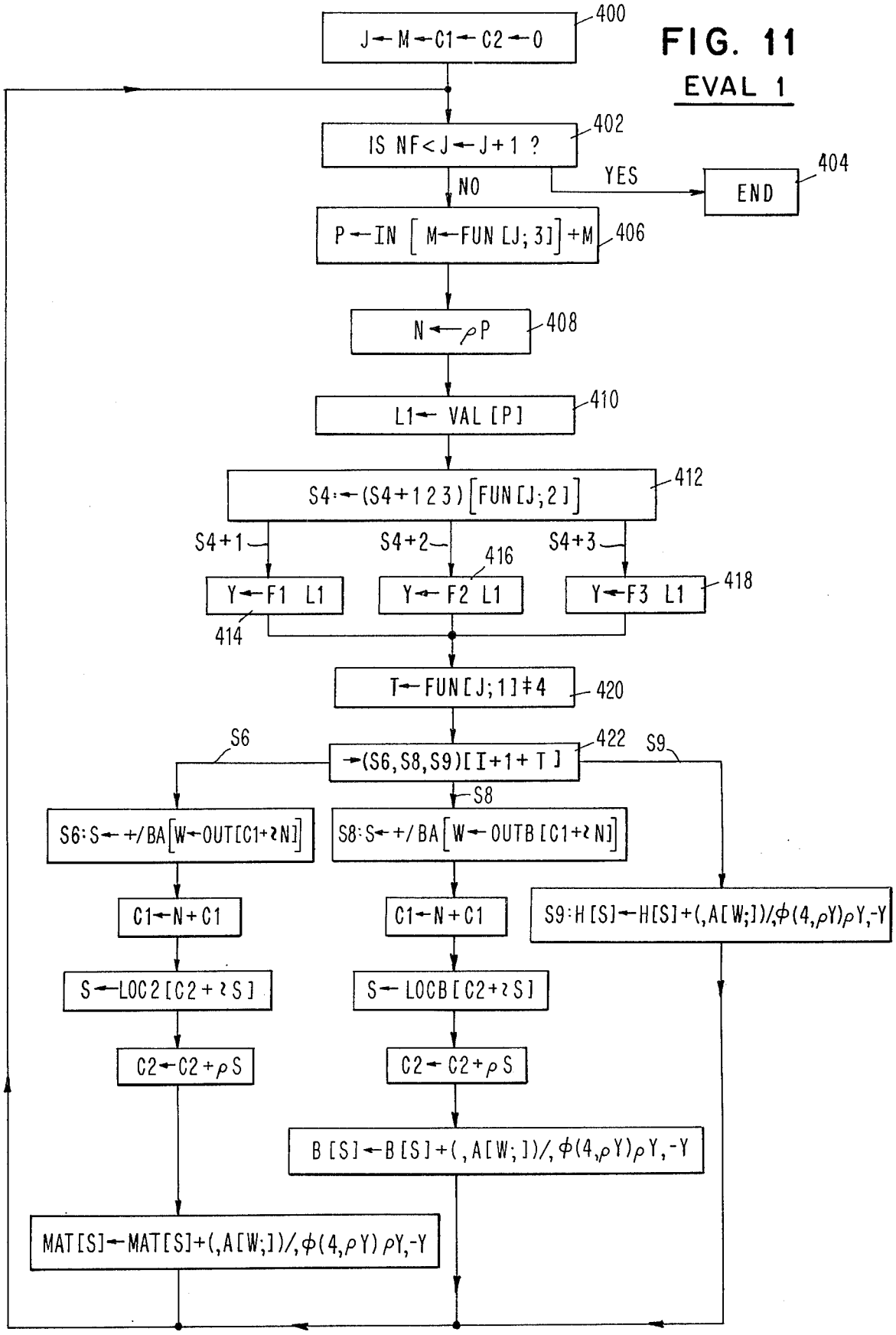
Figures 12, 12A:
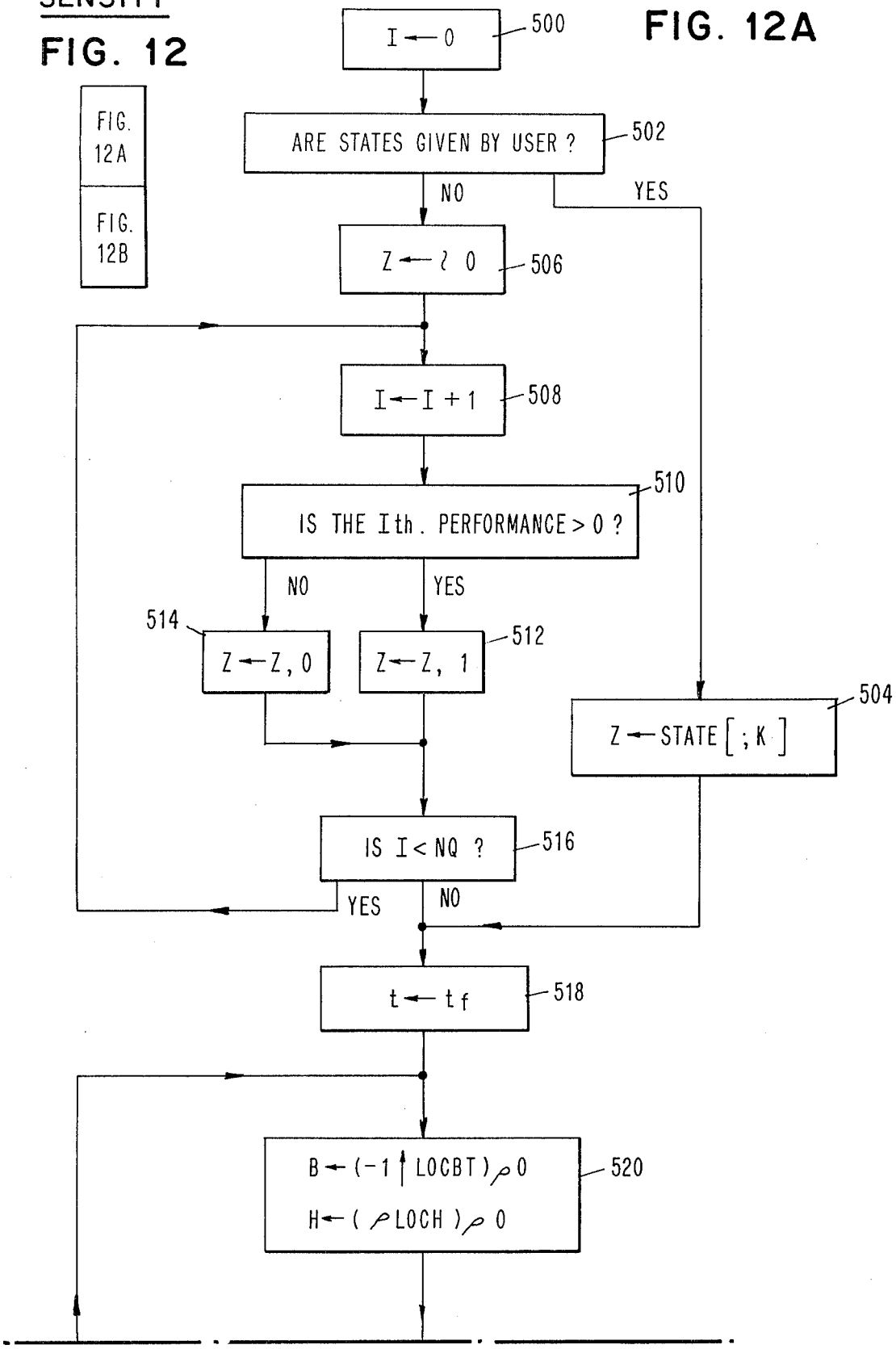
Figure 12B:
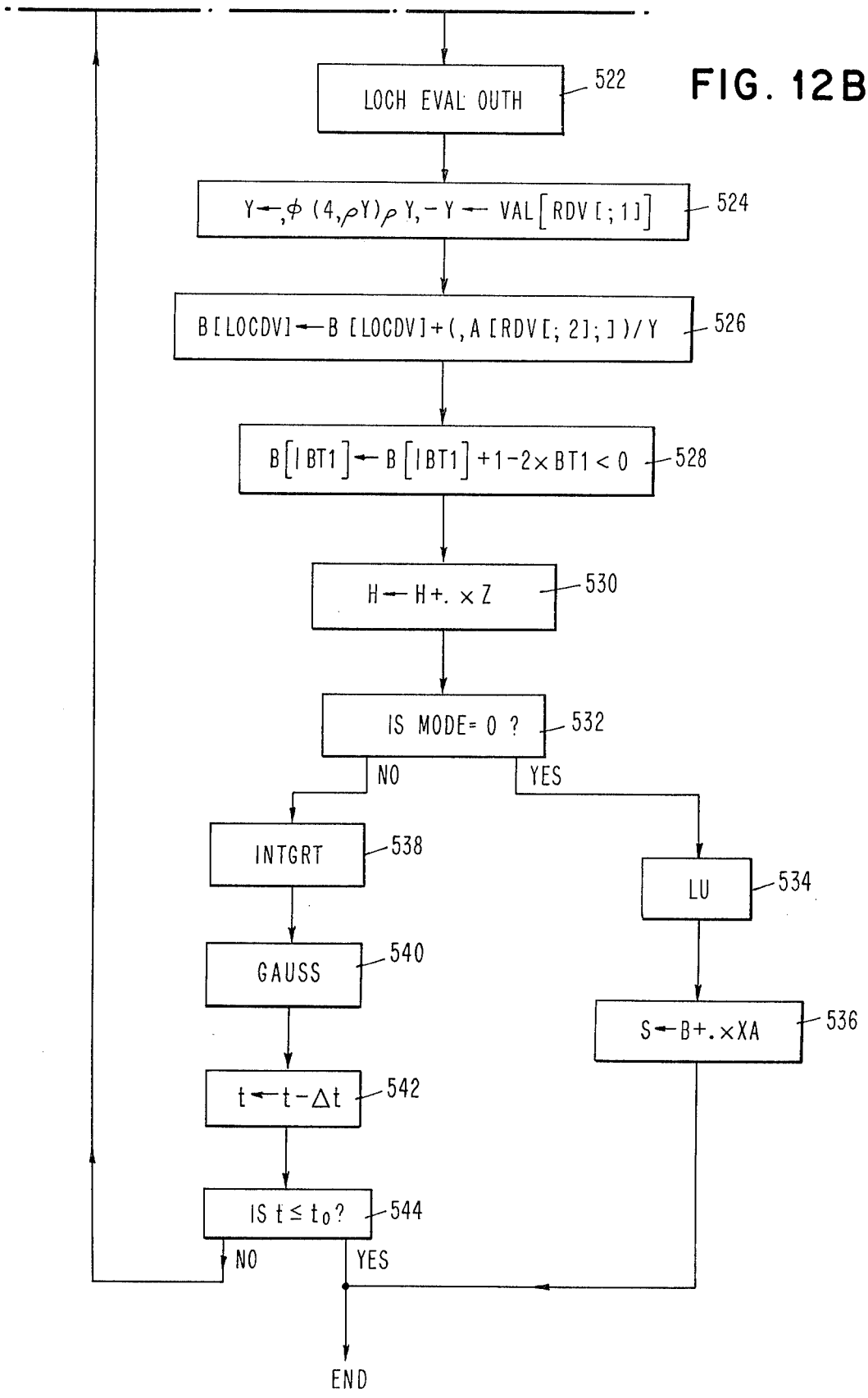

DEFENSIVE PUBLICATION

UNITED STATES PATENT AND TRADEMARK OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent and Trademark Office makes no assertion as to the novelty of the disclosed subject matter.

PUBLISHED NOVEMBER 4, 1975

940 O.G. 8

T940,013

NETWORK DESIGN PROCESS USING MULTIPLE PERFORMANCE FUNCTIONS

Chung W. Ho, Mahopac, N.Y., assignor to International Business Machines Corporation, Armonk, N.Y.

Continuation of abandoned application Ser. No. 331,711, Feb. 13, 1973. This appplication Sept. 17, 1974, Ser. No. 506,395

Int. Cl. G06f *15/06, 15/56*

U.S. Cl. 444—1

10 Sheets Drawing. 57 Pages Specification

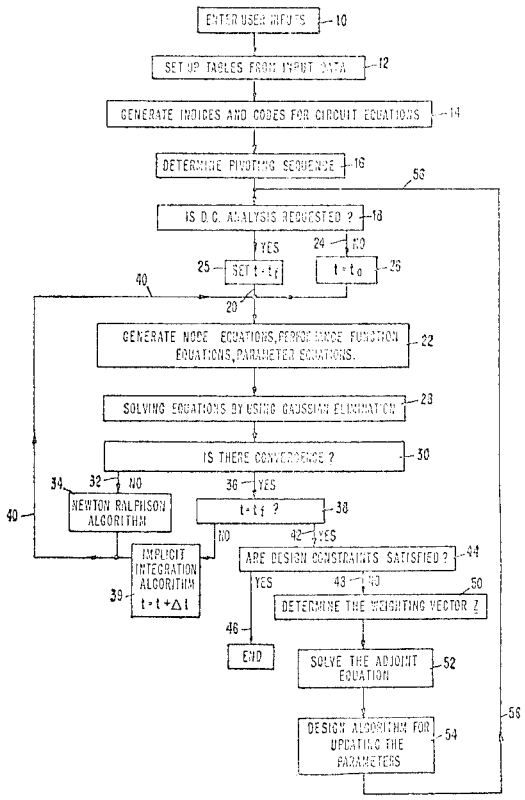

This is an automated process for analyzing electrical networks.

The user of the process introduces into a computer system, initialized with a program for carrying out the process, input information consisting of a symbolic representation of an electrical network structure plus a plurality of network performance functions, together with the network elements, some of which are defined as design parameters. The input information is placed in a data storage means and is arranged into a plurality of arrays, pointers, and tables needed by the process to operate on the input information introduced by the user. The process performs either a steady state or transient analysis of the given electrical network and provides as output a list of values for the design parameters which optimize the given plurality of performance functions.

The process solves a set of node equations, performance equations, and parameter equations for either the steady state or transient state cases. Then, the adjoint equation is solved by utilizing a weighting vector Z which attaches a relative significance to each of the performances. Both sets of equations are solved in an iterative loop to generate a sensitivity vector which is used to converge on an optimized solution of the multiple performances given by the user.

FUNS

J: RUNNING COUNTER FOR NAM1

FLOC

PARL M

PARS

FIG. 8

PMAT

```
Y← DV2
A←4 4⍴1000110001001111
Y←⌽(4,⍴Y)⍴Y,-Y
P←(,A[RDEGN[;3];])⌹Y
Q←((⍉⍴L)∊L⍉L)/LOCD
MAT[Q]←MAT[Q]+(Q∘.=L)+.×P
```

FIG. 9

MATBH

```
L←LOCB,LOCDV,|BT1
L←((⍉⍴L)∊L⍉L)/L
LOCBT←1+(ND,NTOT)⊤L-1
LOCBT[2;]←R⍉LOCBT[2;]
CPH←⍋(NTOT,1)+.×LOCBT
LOCBT←LOCBT[;CPH]
L←L[CPH]
LOCVD←L⍉LOCDV
LOCB←L⍉LOCB
BT1←(1-2×BT1<0)×L⍉|BT1
CPH←1+(NQ,NTCT)⊤LOCH-1
CPH[2;]←C⍉CPH[2;]
LOCH←⍉⍴LOCH
```

EXEC 2

EVAL 1

SENSITY